(12) United States Patent
Everly

(10) Patent No.: US 7,531,730 B2
(45) Date of Patent: May 12, 2009

(54) NON-TOXIC CHEMICAL MUSICAL INSTRUMENT STRING COATING AND PRESERVATIVE

(76) Inventor: Phillip Jason Everly, 2307 W. Victory Blvd., Burbank, CA (US) 91506

( * ) Notice: Subject to any disclaimer, the term of this patent is extended or adjusted under 35 U.S.C. 154(b) by 0 days.

(21) Appl. No.: 11/347,641

(22) Filed: Feb. 3, 2006

(65) Prior Publication Data

US 2006/0174746 A1  Aug. 10, 2006

Related U.S. Application Data

(60) Provisional application No. 60/651,448, filed on Feb. 8, 2005.

(51) Int. Cl.
*G10D 3/08* (2006.01)
*G10D 3/10* (2006.01)

(52) U.S. Cl. ............... 84/313; 84/199; 84/290; 84/297 R; 84/455

(58) Field of Classification Search ......... 84/313, 84/199, 297 R, 294–295, 455; 524/544; 526/245; 560/223; 564/209
See application file for complete search history.

(56) References Cited

U.S. PATENT DOCUMENTS

| | | | |
|---|---|---|---|
| 4,121,494 A | 10/1978 | Reno et al. | |
| 4,539,228 A | 9/1985 | Lazarus | |
| 4,563,388 A * | 1/1986 | Bonk et al. | 428/304.4 |
| 4,957,982 A * | 9/1990 | Geddes | 526/62 |
| 5,725,789 A * | 3/1998 | Huber et al. | 252/8.62 |
| 6,197,426 B1 | 3/2001 | Coppens | 428/421 |
| 6,528,709 B2 * | 3/2003 | Hebestreit et al. | 84/297 S |
| 6,649,719 B2 * | 11/2003 | Moore et al. | 526/245 |
| 6,894,105 B2 * | 5/2005 | Parent et al. | 524/520 |
| 7,078,456 B2 * | 7/2006 | Jariwala et al. | 524/544 |
| 7,166,329 B2 * | 1/2007 | Dams | 427/344 |
| 2002/0042470 A1 * | 4/2002 | Moore et al. | 524/544 |
| 2003/0171484 A1 * | 9/2003 | Dams | 524/544 |
| 2003/0183061 A1 * | 10/2003 | Van Pamel | 84/297 S |
| 2004/0016370 A1 * | 1/2004 | Olson | 106/498 |
| 2005/0037938 A1 * | 2/2005 | Reinhoudt et al. | 510/285 |

FOREIGN PATENT DOCUMENTS

| | | | |
|---|---|---|---|
| JP | 2004-075736 A | * | 3/2004 |
| WO | WO 02/16517 A2 | * | 2/2002 |

OTHER PUBLICATIONS

Product Information Sheet; 3M Novec Electonic Coating EGC-1704; Oct. 2003; 3M Specialty Materials.*
Product Information Sheet; 3M Novec Electonic Coating EGC-1700; Mar. 2001; 3M Specialty Materials.*
Kehiren, Jason; A Comparison of Hydrofluoroether and Other Alternative Solvent Cleaning Systems; 2001; Data Tech; 6th Edition; pp. 53-56.*

* cited by examiner

*Primary Examiner*—Jeffrey Donels
*Assistant Examiner*—Christopher Uhlir
(74) *Attorney, Agent, or Firm*—John K. Buche; Buche & Associates, PC

(57) ABSTRACT

A method of protecting musical instrument strings comprising the steps of applying a fluorochemical acrylate polymer coating carried in a hydrofluoroether solvent to the strings of a musical instrument, so as to leave a low surface energy film covering the strings at a thickness of less than one micron which is resistant to oils and dirt, and provides virtually no interference with the sound generating properties of the string. The polymer coating is non-toxic, non-ozone depleting, non-flammable and contains not volatile organic compounds. The polymer is insoluble in solvents including heptane, toluene and water, however it is soluble in fluorinated solvents.

28 Claims, No Drawings

NON-TOXIC CHEMICAL MUSICAL INSTRUMENT STRING COATING AND PRESERVATIVE

CROSS-REFERENCE TO RELATED APPLICATION

This is a utility patent application which claims benefit of U.S. Provisional Application No. 60/651,448 filed on Feb. 8, 2005.

FEDERALLY SPONSORED RESEARCH

Not Applicable

SEQUENCE LISTING OR PROGRAM

Not Applicable

STATEMENT REGARDING COPYRIGHTED MATERIAL

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND

The present invention relates in general to methods of protecting musical instrument strings, and more particularly to using a non-toxic chemical preservative treatment or coating applied to musical instrument strings.

A musical instrument string typically comprises a core of material and optionally additional strands of the same or other material wound around the core. The composition and dimensions of the core and the optional windings are chosen so as to produce the desired tones when the string is caused to vibrate.

There are a number of different types of musical strings employed today, and examples of such strings are guitar, violin, cello, bass, banjo, piano, and harp strings. A large variety of such strings require human contact along at least a portion of the strings, such as in the fingering and plucking of guitar strings in order to be played.

While straight (non-wound) gage strings can be easily wiped of dirt and oil after use, wound strings tend to become contaminated with dirt, skin oils, and perspiration after even a few hours of playing. When dirt and other contaminants infiltrate the windings of the string, the string's characteristics and characteristics of the sounds they produce are altered.

After a relatively short period of time, a typical wound string will become musically "dead" due to the build-up of this contamination. Presently, wound strings that lose their tonal qualities must be removed from the instrument and either cleaned or replaced. This process is burdensome, time consuming, and expensive for musicians who play frequently and require high tonal quality. This problem can be resolved if the strings are coated with a substance to avoid contamination of the wound string windings and/or to provide some cushioning or smooth cover for the strings.

Several methods and treatments for protecting natural characteristics of the strings are known in the art. For example, U.S. Pat. No. 4,121,494 to Reno discloses an elongated clip configured shield designed to encase the strings of a musical instrument. The shield is formed of a flexible plastic material and a cloth lining adhered within. The cloth lining is impregnated with a rust and moisture inhibitor chemical. However, the method of protecting the string by using the shield is different from the chemical preservative treatment of the present invention, which is directly applied to the strings of a musical instrument.

U.S. Pat. No. 4,539,228 to Lazarus deals with extending the life of musical instrument strings through the application of polytetrafluoroethylene (PTFE) in an oil lubricant medium. U.S. Pat. No. 6,528,709 to Hebestreit discloses an improved musical instrument string wherein the string includes a layer of expanded polytetrafluoroethylene (ePTFE) that protects the string from contamination. However, the disadvantage of the above two inventions is that they employ a chemical such as PTFE or ePTFE that possess higher surface energy values and/or produce a surface coating thickness of more than 1 micron. The main problem associated with the coating thickness, particularly in the case of PTFE is that it tends to "deaden the sound". The non-toxic chemical utilized in the present invention differs from these chemicals.

U.S. Pub. No. 20030183061 to Van Pamel discloses a hydrophobic polymer treatment for strings. A hydrophobic polymer is adhesively coated on the surfaces of the wound string within its interstitial voids, while the exterior surfaces remain uncoated. The polymer is applied by soaking the string in a liquid polymeric solution to flow the solution into the interstitial voids. The string is removed from the bath and the residual solution is removed from the exterior surface of the string using a resilient scraper. Suitable hydrophobic polymers that have low surface energies, low biomolecular absorption, shed organic solvents, and low resultant surface coating thickness of around 1 micron can be used. Although treatment with the hydrophobic polymers results in low surface energy and coating thickness, the chemical composition of the present invention is different in that it includes a fluorochemical acrylate polymer coating carried in a hydrofluoroether solvent.

Therefore, the object of the present invention is to provide a lower surface energy value than PTFE or ePTFE and maintain the integrity of the sound produced by the strings by using the fluorochemical acrylate polymer coating carried in the hydrofluoroether solvent. Other objects of the present invention will become better understood with reference to the appended Summary, Description, and Claims.

SUMMARY

The present invention is a method of preserving the tonal quality of acoustic instrument strings with the administration of a non-toxic chemical preservative treatment or coating and more particularly to a non-toxic chemical preservative treatment or coating as applied to musical instrument strings. The chemical treatment is a clear, low viscosity solution of a fluorochemical acrylate polymer coating carried in a hydrofluoroether solvent. The solvent is non-flammable and contains no volatile organic compounds. The coating results in a film that has low surface energy values and a thickness of less than 1 micron.

DETAILED DESCRIPTION

The novel features of the present invention will become apparent from the following description of the preferred embodiment of the invention. The present invention is a method of protecting musical instrument strings using a non-toxic chemical preservative treatment or coating. The chemical treatment is a clear, low viscosity solution of a fluorochemical acrylate polymer coating carried in a hydrofluoroether solvent. The solvent is non-flammable, has low toxicity and contains no volatile organic compounds.

The coating can be applied to clean and moisture free strings by dipping, spraying, or brushing. The coating will form a clear, nearly invisible, uniform film that is insoluble in solvents such as heptane, toluene, and water. The film is strippable with fluorinated solvents. The films can endure up to 175° C. for prolonged periods and include excellent anti-wetting, anti-sticking, anti-migration, and anti-corrosion properties. The film exhibits excellent repellency to hydrocarbon oils, silicone oils, synthetic fluids and aqueous solutions.

With a surface energy of 11 to 12 dynes/cm, the resultant film compares favorably to coating of polyethylene and polytetrafluoroethylene (PTFE), which have surface energy values of approximately 31 and 18 dynes/cm, respectively. Therefore, the use of a fluorochemical acrylate polymer coating carried in a hydrofluoroether solvent with its lower surface energy value allows the resultant film to be both resistant to oils and dirt, which allows greatly increased lifespan, as well as providing virtually no interference with the natural sound generating properties of the musical instrument string.

Typical surface coating thickness or film thickness arrived at in the present invention is less than 1 micron. This solves the main complaint with PTFE coatings as they tend to "deaden the sound" due to higher surface coating thickness values. With a lower surface energy than PTFE, a fluorochemical acrylate polymer coating carried in a hydrofluoroether solvent makes the surface feel as though there is virtually no coating, maximizes the natural feel of the musical instrument string and allows the string to produce natural resonance characteristics.

The coating can be applied to any clean, moisture-free surfaces such as copper, aluminum, ceramic, steel, tin or glass, and therefore it can be used in many diverse applications. For example, in the electronics industry for coating printed circuit boards, MR heads, micro motors, ball bearing tracks, MEMS, ink jet print cartridges and various components in hard disk drives. Since the resultant low surface energy film repels liquids such as lubricating oils, silicones, and photoresist solutions used in the manufacturing of semiconductors, it is ideal for coating musical instrument strings.

All features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, paragraph 6. In particular, the use of "step of" in the claims herein is not intended to invoke the provisions of 35 U.S.C. § 112, paragraph 6.

Although preferred embodiments of the present invention have been shown and described, various modifications and substitutions may be made thereto without departing from the spirit and scope of the invention. Accordingly, it is to be understood that the present invention has been described by way of illustration and not limitation.

I claim:

1. A method of enhancing the sound quality of musical instrument strings comprising the steps of:

coating a musical instrument string with a fluorochemical acrylate polymer film of approximately 1 micron, or less, by treating said string with a solution of fluorochemical acrylate polymer solute and hydrofluoroether solvent;

allowing the film to dry.

2. The method of claim 1, wherein said coating is non-toxic, non-ozone depleting, non-flammable and contains no volatile organic compounds.

3. The method of claim 1, wherein said film has surface energy of not more than 12 dynes/cm and no less than 11 dynes/cm.

4. The method of claim 1, wherein said film is insoluble in solvents chosen from the list of heptanes, toluene, and water.

5. The method of claim 1 wherein said film is applied so as to be soluble in fluorinated solvents.

6. The method of claim 1, wherein said film can withstand temperatures of up to 175 degrees centigrade.

7. The method of claim 1 wherein said treatment of said string with said solution is accomplished by any of the means consisting of either emersion, bespatter, topical application, dipping, spraying, or brushing.

8. The method of claim 1 wherein said string is clean and moisture-free prior to said treatment, so that said film is transparent with anti-wetting, anti-sticking, anti-migration, and anti-corrosion properties after said film has dried.

9. A musical instrument string comprising:

a musical string;

a fluorochemical acrylate polymer coating on said musical string, said coating further having a thickness of approximately 1 micron, or less.

10. The musical instrument string of claim 9, wherein said coating is non-toxic, non-ozone depleting, non-flammable and contains no volatile organic compounds.

11. The musical instrument string of claim 9, wherein said coating has surface energy of not more than 12 dynes/cm and no less than 11 dynes/cm.

12. The musical instrument string of claim 9, wherein said coating is insoluble in solvents chosen from the list of heptanes, toluene, and water.

13. The musical instrument string of claim 9, wherein said coating can withstand temperatures of up to 175 degrees centigrade.

14. The musical instrument string of claim 9, wherein said coating is the result of treatment of said musical string with a solution of fluorochemical acrylate polymer solute and hydrofluoroether solvent.

15. The musical instrument string of claim 9, wherein said coating is transparent with anti-wetting, anti-sticking, anti-migration, and anti-corrosion properties.

16. A method of fabricating musical instrument strings comprising the steps of:

obtaining a clean and moisture free musical string;

coating said string with a fluorochemical acrylate polymer film of less than 1 micron by treating said string with a solution of fluorochemical acrylate polymer solute and hydrofluoroether solvent;

allowing said film to dry.

17. The method of claim 16, wherein said treatment of said string with said solution is accomplished by any of the means consisting of either emersion, bespatter, topical application, dipping, spraying, or brushing.

18. The method of claim 16, wherein said coating is non-toxic, non-ozone depleting, non-flammable and contains no volatile organic compounds.

19. The method of claim 16, wherein said coating has surface energy of not more than 12 dynes/cm and no less than 11 dynes/cm.

20. The method of claim 16, wherein said coating is insoluble in solvents chosen from the list of heptanes, toluene, and water.

21. The method of claim 16, wherein said coating can withstand temperatures of up to 175 degrees centigrade.

22. The method of claim 16, wherein said coating is the result of treatment of said musical string with a solution of fluorochemical acrylate polymer solute and hydrofluoroether solvent.

23. The method of claim 16, wherein said coating is transparent with anti-wetting, anti-sticking, anti-migration, and anti-corrosion properties.

24. A stringed musical instrument comprising:
 a musical instrument chosen from the group consisting of guitar, violin, cello, bass, banjo, piano, and harp;
 at least one musical string featuring a fluorochemical acrylate polymer coating having a thickness of approximately 1 micron, or less.

25. The method of claim 1, wherein said coating partially covers all surfaces of said string.

26. The musical instrument string of claim 9, wherein said coating partially encompasses said string.

27. The method of claim 1, wherein said coating partially encompasses said string.

28. The method of claim 16, wherein said coating partially encompasses said string.

* * * * *